(12) United States Patent
Fishburn et al.

(10) Patent No.: US 7,119,024 B2
(45) Date of Patent: Oct. 10, 2006

(54) METHOD AND STRUCTURE FOR A SELF-ALIGNED SILICIDED WORD LINE AND POLYSILICON PLUG DURING THE FORMATION OF A SEMICONDUCTOR DEVICE

(75) Inventors: Fredrick D. Fishburn, Boise, ID (US); Terrence B. McDaniel, Boise, ID (US); Richard H. Lane, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 175 days.

(21) Appl. No.: 10/619,052

(22) Filed: Jul. 10, 2003

(65) Prior Publication Data
US 2005/0009343 A1 Jan. 13, 2005

(51) Int. Cl.
*H01L 21/302* (2006.01)
(52) U.S. Cl. .......... 438/720; 438/649; 438/706
(58) Field of Classification Search .......... 438/642, 438/647, 649, 664, 706, 710, 7, 720
See application file for complete search history.

(56) References Cited

U.S. PATENT DOCUMENTS

| | | |
|---|---|---|
| 5,198,384 A | 3/1993 | Dennison .......... 437/47 |
| 5,381,302 A | 1/1995 | Sandhu et al. .......... 361/305 |
| 5,422,296 A | 6/1995 | Lage .......... 437/52 |
| 5,536,683 A | 7/1996 | Lin et al. .......... 437/200 |
| 5,627,093 A | 5/1997 | Hachisuka et al. .......... 438/649 |
| 5,854,127 A | 12/1998 | Pan .......... 438/629 |
| 5,899,742 A | 5/1999 | Sun .......... 438/682 |
| 5,998,257 A | 12/1999 | Lane et al. .......... 438/253 |
| 6,013,547 A | 1/2000 | Liaw .......... 438/238 |
| 6,074,960 A | 6/2000 | Lee et al. .......... 438/749 |
| 6,096,638 A | 8/2000 | Matsubara .......... 438/649 |
| 6,175,146 B1 | 1/2001 | Lane et al. .......... 257/635 |
| 6,194,315 B1 | 2/2001 | Hu et al. .......... 438/683 |
| 6,261,899 B1 | 7/2001 | Lane et al. .......... 438/253 |
| 6,383,863 B1 * | 5/2002 | Chiang et al. .......... 438/241 |
| 6,486,060 B1 | 11/2002 | Hermes et al. .......... 438/649 |
| 6,635,536 B1 * | 10/2003 | Shin et al. .......... 438/276 |

* cited by examiner

*Primary Examiner*—Lan Vinh
(74) *Attorney, Agent, or Firm*—Kevin D. Martin

(57) ABSTRACT

A method used to form a semiconductor device provides a silicide layer on a plurality of transistor word lines and on a plurality of conductive plugs. In one embodiment, the word lines, one or more sacrificial dielectric layers on the word lines, conductive plugs, and a conductive enhancement layer are formed through the use of a single mask. An in-process semiconductor device which can be formed using one embodiment of the inventive method is also described.

35 Claims, 8 Drawing Sheets

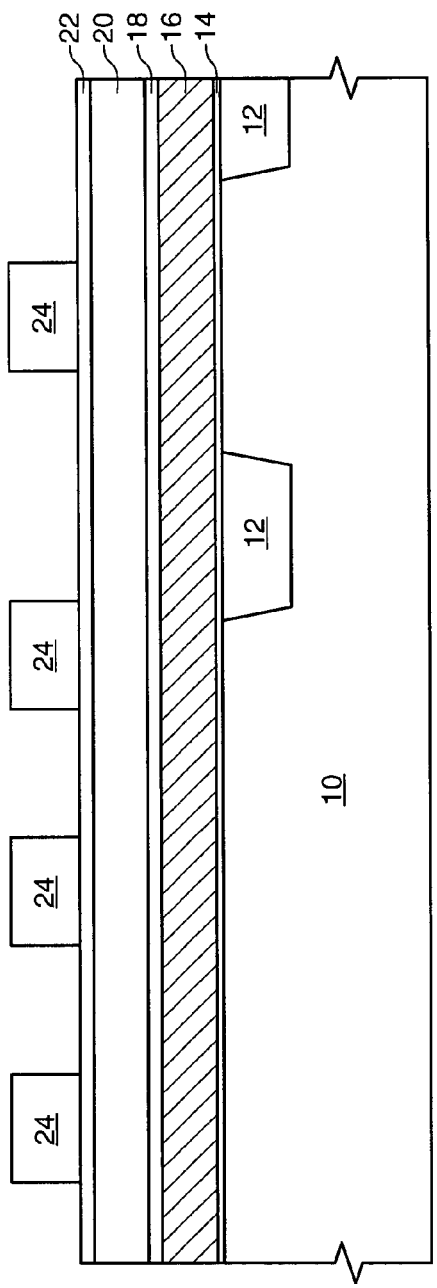
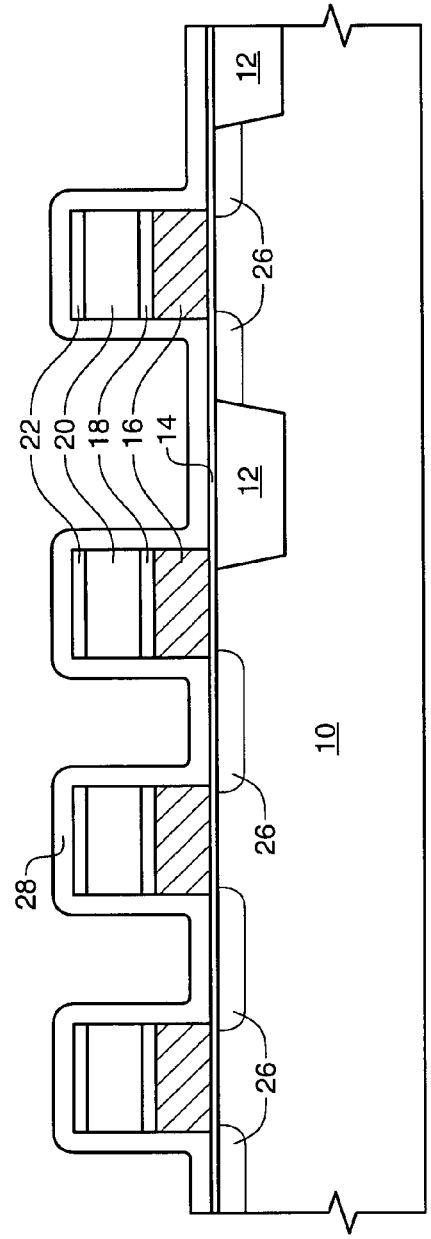

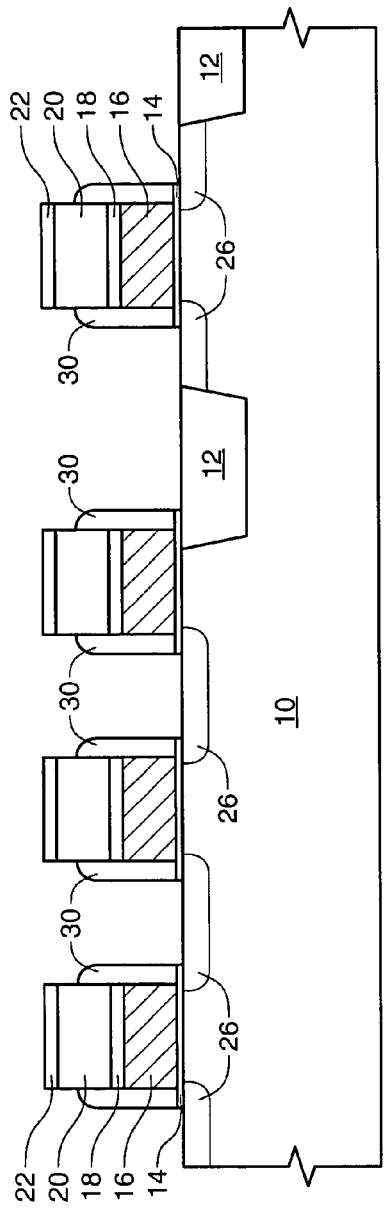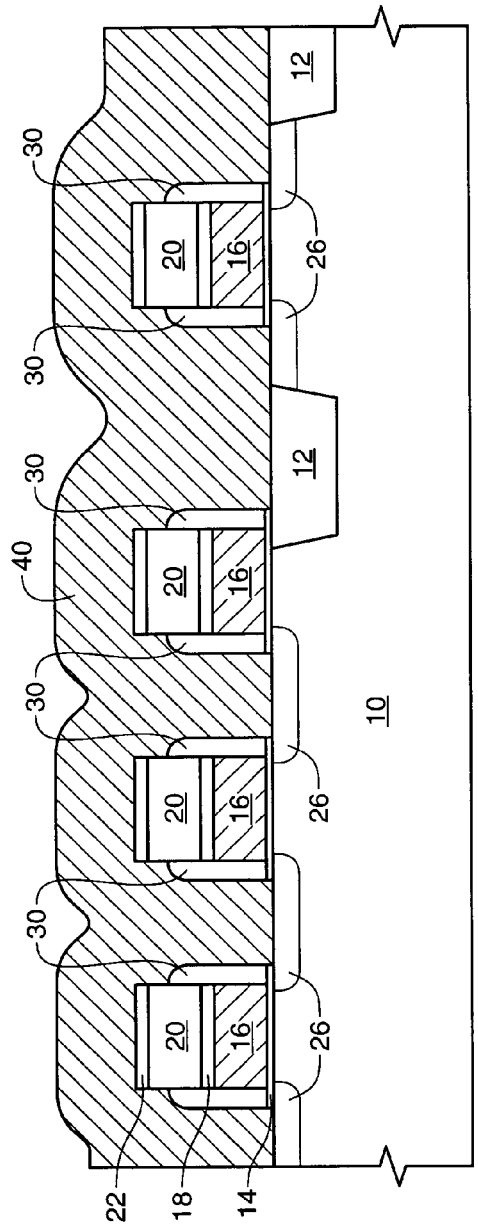

METHOD AND STRUCTURE FOR A SELF-ALIGNED SILICIDED WORD LINE AND POLYSILICON PLUG DURING THE FORMATION OF A SEMICONDUCTOR DEVICE

FIELD OF THE INVENTION

This invention relates to the field of semiconductor manufacture, and more particularly to a process for forming self-aligned conductive structures having enhanced conductivity through an enhancement layer, and an inventive structure resulting from the process.

BACKGROUND OF THE INVENTION

Structures such as polycrystalline silicon (polysilicon) plugs, interconnects, and transistor gates are commonly formed during the manufacture of semiconductor devices such as microprocessors, memory devices, and logic devices. To manufacture a plug, for example, a masked dielectric layer is formed over an underlying substrate assembly and an etch is completed to form a hole in the dielectric which exposes the underlying structure in the area where contact is to be made. A blanket polysilicon layer is deposited over the dielectric layer which fills the hole in the dielectric layer and contacts the underlying structure. The polysilicon is then removed from a planar surface of the dielectric, typically using mechanical polishing such as a chemical mechanical polishing (CMP) process which leaves the plug formed within the dielectric layer. Interconnects and gates are typically formed by depositing a blanket layer of polysilicon over a semiconductor substrate assembly, then masking and etching the layer.

As the sizes of the plugs and line widths decrease with improved manufacturing technology, the doped polysilicon structure may provide insufficient conductance and excessive resistance. To reduce the resistance of a structure, a silicide layer is often formed underneath the plug or over the top of the plug, gate or interconnect. To form the silicide layer to enhance plug conductivity the silicide layer can be formed before formation of the plug. A titanium chemical vapor deposition (CVD) process results in titanium reacting with the exposed silicon wafer to form titanium silicide. An unreacted titanium metal layer will also form over any exposed dielectric layer which is then stripped. After stripping the unreacted titanium, the polysilicon plugs are formed over the silicide layer as described above.

A silicide layer can also be formed over the plug, transistor gate or other interconnect after forming the blanket polysilicon layer which forms the gate or interconnect. During a titanium CVD process similar to that described above for forming silicide under the plug, the titanium reacts with the polysilicon to form silicide on top of the polysilicon layer, then the polysilicon is masked and etched to define the line or plug.

While the silicide layer interposed between the silicon wafer and the polysilicon plug provides decreased resistance and increased conductance, it can also provide a path for leakage between an adjacent transistor channel region and an active area, thereby increasing junction leakage.

The following U.S. Patents, each assigned to Micron Technology, Inc. and incorporated herein by reference as if set forth in their entirety, describe various processes for forming silicide layers: U.S. Pat. No. 5,381,302 by Sandhu et al.; U.S. Pat. No. 5,198,384 by Dennison; U.S. Pat. No. 6,074,960 by Lee, et al.; U.S. Pat. No. 6,194,315 by Hu, et al.; and U.S. Pat. No. 6,486,060 by Hermes, et al.

In particular, U.S. Pat. No. 6,486,060 discloses a process for forming a self-aligned titanium silicide layer over a plurality of polysilicon features, including conductive plugs and transistor gates (word lines). While the titanium silicide layer itself is self-aligned, a patterned dielectric layer which defines the subsequently-formed titanium silicide layer over transistor gates is not self-aligned to the locations on which the titanium silicide is to be formed. As feature sizes decrease, it becomes increasingly desirable to provide structures which are completely self-aligned with other structures where possible to decrease product loss which may result from misaligned mask layers and to decrease other costs associated with providing patterned masks. Further, titanium silicide becomes more difficult to scale as feature sizes decrease.

A process and structure which provides improved conductance and reduced resistance and which does not increase junction leakage would be desirable. It would be further useful to provide a plug having a maximized amount of silicide formed thereon. Additionally, it would be advantageous to have a process with which the silicide, as well as any layers required to form the silicide, is self-aligned to various polysilicon features and scaleable with decreasing features sizes.

SUMMARY OF THE INVENTION

The present invention provides a new method and structure which, among other advantages, reduces problems associated with the manufacture of semiconductor devices, particularly problems resulting from the formation of a mask during a process which provides a silicide layer over various polysilicon features. An embodiment of the invention further provides an advantage of the formation of a silicide layer which is more scaleable with decreasing features sizes than previous silicide layers.

In accordance with one embodiment of the invention, a semiconductor wafer substrate assembly is provided which comprises a semiconductor wafer, a blanket transistor gate (word line) layer of polysilicon, blanket dielectric layers overlying the blanket transistor gate layer which can be removed selective to polysilicon and to a spacer layer, and a patterned mask layer which will define the transistor gates. Subsequently, the transistor gate layer and the dielectric layer overlying the gate layer are etched with a single mask pattern to define a plurality of transistor gates. Dielectric spacers are then formed alongside and contacting the transistor gate and overlying dielectric layers. A blanket polysilicon layer is then formed and planarized to provide a plurality of self-aligned plugs. Subsequently, the dielectric layers over the polysilicon gate layer are removed to expose the transistor gates (word lines), which also exposes a surface of the spacers. A blanket metal layer is formed over the surface of the structure, which includes forming the layer on the polysilicon plugs and gates, and on the exposed portions of the spacers. The metal which contacts the polysilicon material of the gates and plugs is converted to metal silicide, while the metal contacting the dielectric features is not converted. Finally, the unconverted metal is removed using an etch which is selective to the metal silicide (i.e. removes the metal while removing none or very little of the metal silicide) and wafer processing continues to form a semiconductor device.

Additional advantages will become apparent to those skilled in the art from the following detailed description read in conjunction with the appended claims and the drawings attached hereto.

BRIEF DESCRIPTION OF THE DRAWINGS

FIGS. 1–9 are cross sections.

Figure 5:
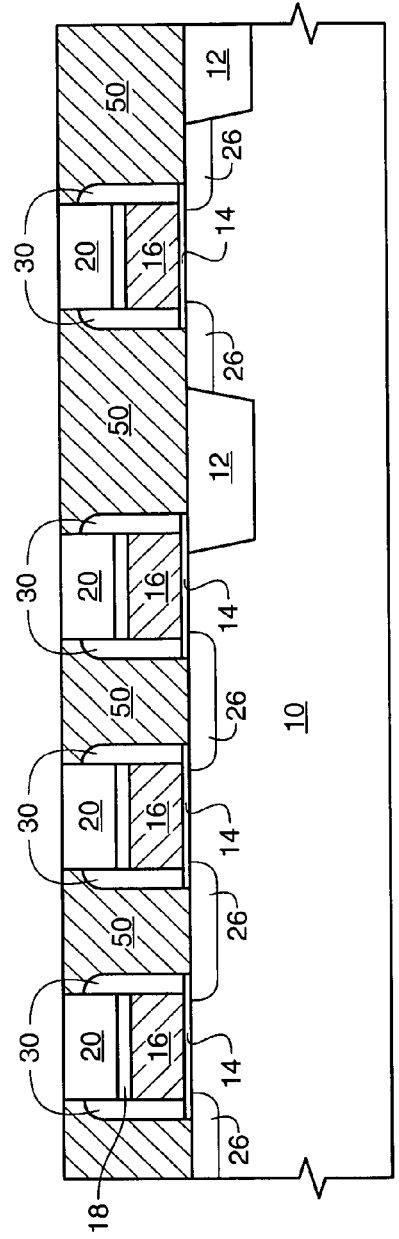

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been performed to provide regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but could be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein.

A first embodiment of an inventive method to provide an enhancement layer, for example silicide, which increases conductivity of another less conductive layer, for example polysilicon, over a plurality of features is depicted in FIGS. 1–10. FIG. 1 depicts the following structures: single crystal silicon semiconductor wafer 10; shallow trench isolation (STI) oxide 12; gate oxide layer 14; polysilicon transistor gate (word line) layer 16 about 1,000 angstroms (Å) thick; tetraethyl orthosilicate (TEOS) dielectric buffer layer 18 about 100 Å thick; silicon nitride ($Si_3N_4$) gate capping layer 20 about 1,000 Å (1 KÅ) thick; TEOS top capping layer 22 about 200 Å thick; and patterned photoresist layer 24. These layers can be formed by one of ordinary skill in the art from the description herein. One function of buffer layer 18 is to ensure that polysilicon 16 is not damaged during the formation of $Si_3N_4$ layer 20.

It should be noted that the materials and thicknesses specified herein are exemplary for a specific embodiment, and other materials and thickness would be evident to one of ordinary skill in the art from this description. Further, other structures such as STI nitride and doped N-wells and P-wells within the wafer will likely be present and evident to one of ordinary skill in the art, but are not depicted for simplicity of explanation.

After forming the FIG. 1 structure, a vertical (anisotropic) etch is performed within an etch chamber using the resist 24 as a pattern to define the transistor gates from polysilicon layer 16. The etch stops on (or within) gate oxide 14. An etchant which would remove each of layers 16–22 includes flowing $CF_4$, $CH_2F_2$, $NF_3$, $Cl_2$, HBr, or $HeO_2$ at a flow rate of between about 20 standard cubic centimeters per minute (sccm) and about 75 sccm. During the etch the wafer is maintained at a temperature of between about 60° C. and about 70° C., and the pressure within the etch chamber is maintained to between about 5 millitorr and about 60 millitorr, and the power is maintained to between about 150 Watts and about 1,000 Watts. Using these settings, TEOS layers 22, 18 and silicon nitride layer 20 are each etched at a rate of between about 30 Å/sec and about 40 Å/sec, and polysilicon layer 16 is etched at a rate of between about 10 Å/sec and about 30 Å/sec.

After etching the transistor gate stack, any necessary wafer doping is performed, for example to form source/drain (active area) regions 26, then a spacer layer 28, for example a conformal layer of silicon nitride, is formed as depicted in FIG. 2. A silicon nitride layer between about 20 Å and about 500 Å thick would be sufficient, and is easily manufactured by one of ordinary skill in the art.

After forming the FIG. 2 structure, a vertical spacer etch is performed, for example using $O_2$ and $CH_2F_2$ at a total flow rate of between about 10 sccm and about 40 sccm for a duration of between about 10 seconds and about 40 seconds. This etch is highly selective to silicon dioxide, such as layers 22 and 14, and highly anisotropic such that silicon nitride layer 20 is not substantially etched laterally. Once the nitride is removed from horizontal surfaces, the etch stops on top capping layer 22 and gate oxide 14. Subsequent to forming the spacers, any exposed gate oxide remaining over the wafer surface is cleared to expose the wafer surface between the transistor gates to result in the structure of FIG. 3 including spacers 30. During the etch of the gate oxide 14, a portion of oxide top capping layer 22 is also removed, but as it is thicker than gate oxide 14 at least a portion of layer 22 remains.

Next, a blanket polysilicon layer 40 is formed over the FIG. 3 structure to result in the structure of FIG. 4. As known in the art, layer 40 must be formed at least half as thick as the widest distance between adjacent features to ensure the spaces between all features are completely filled. In this exemplary embodiment, a polysilicon layer 40 between about 500 Å and about 4,000 Å is formed. Subsequently, the polysilicon layer 40, the top capping layer 22, and, possibly, a portion of silicon nitride gate capping layer 20 are planarized to result in the FIG. 5 structure comprising polysilicon plugs 50 which contact source/drain regions 26. The FIG. 4 structure can be planarized using a mechanical polishing process, for example a chemical mechanical polishing (CMP) process, as known in the art.

The structure of FIG. 5 is subjected to a vertical anisotropic etch to remove gate capping layer 20 and buffer layer 18, which exposes polysilicon 16. An anisotropic etch is used to remove silicon nitride capping layer 20 because nitride spacers 30 are exposed during the etch and it is desirable to leave nitride spacers 30 unetched. Alternately, spacers 30 can be formed from another material, such as TEOS or aluminum oxide ($Al_2O_3$), which allows layers 20 and 18 to be etched selective to spacers 30.

Oxide such as BPSG may be exposed at other wafer locations not depicted in the FIGS., and may be etched during the etch of buffer layer 18. However, the thickness of layer 18 is very thin relative to any BPSG or other oxide at other wafer locations, and the etch of layer 18 will not significantly impact the thickness of oxide exposed at other locations. In the alternative, any regions to be protected can be masked.

Figure 6:
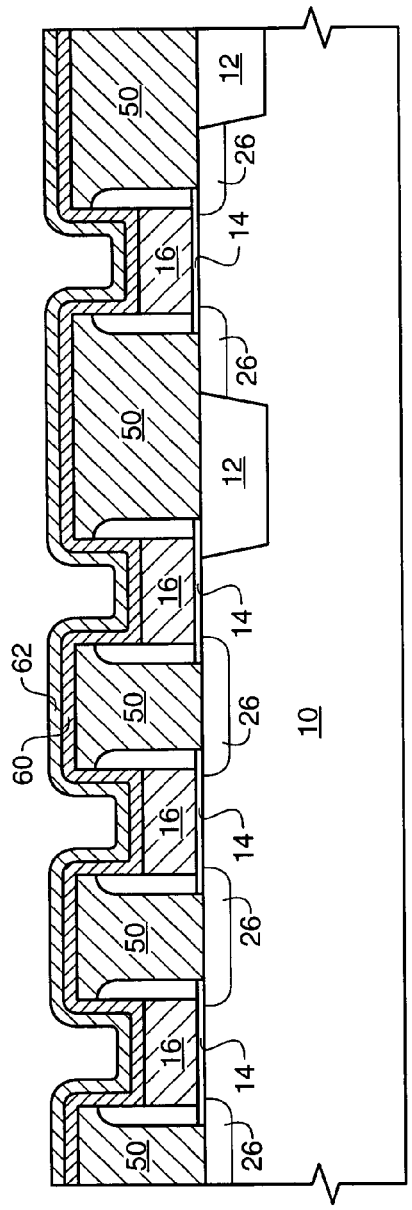
Figure 7:
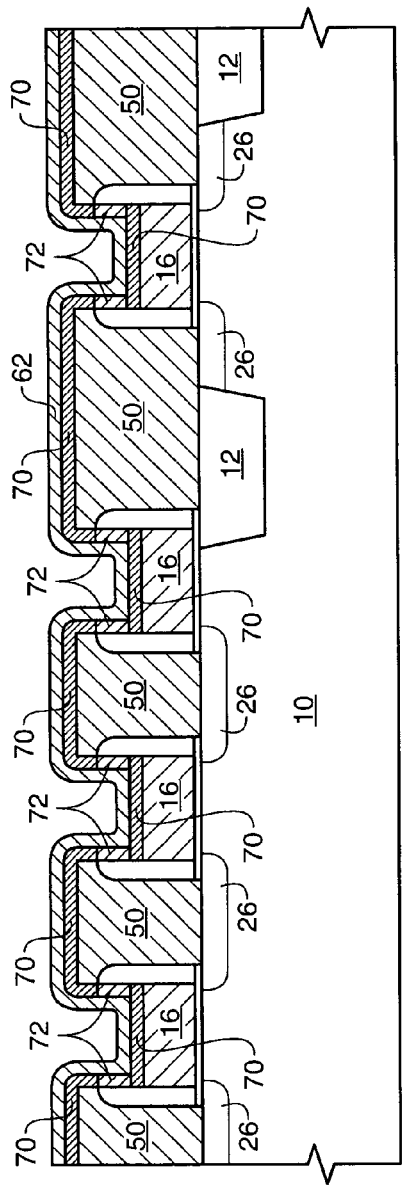

After exposing transistor gates 16 of FIG. 5 by removing capping layer 20 and buffer layer 18, a thin blanket metal layer 60 is formed to contact polysilicon 16 and polysilicon 50, and an optional protective layer 62, for example a metal nitride, is formed on metal layer 60 to result in the FIG. 6 structure. Layer 60 may comprises any metal which will combine with silicon to form metal silicide when in contact with polysilicon 50, 16. Particularly preferred metals include cobalt and nickel, as these metals and their silicides are eminently scaleable with the present process as device feature sizes decrease. A physical vapor deposition (PVD) cobalt or nickel layer between about 5Å and about 1,000 Å, and more preferably between about 10 Å and about 500 Å can be formed by sputtering cobalt or nickel from a cobalt or nickel target onto a wafer in a PVD chamber at a temperature of between about 25° C. and about 85° C. for a duration of between about one second and about 200 seconds. At these temperatures, the selected metal will spontaneously combine with polysilicon 50, 16 into cobalt silicide or nickel silicide. Other workable metals for the present process include titanium and tungsten. After forming metal layer 60, layer 62, such as metal nitride or titanium, can be formed using a CVD or PVD. If used, layer 62 will protect the silicide from exposure to, and possible reaction with, oxygen. Such combination with oxygen will result in a silicide layer having increased resistance, and is therefore to be avoided.

After forming layers 60 and, optionally, 62, the structure of FIG. 6 is annealed, for example using a two-step treatment process. During the first step the FIG. 6 structure, and more particularly polysilicon 16 and metal layer 60, is heated to a temperature of between about 300° C. and about 900° C., and more preferably between about 400° C. and about 700° C., for between about one second to about 10 minutes, and more preferably for between about three seconds and about 60 seconds. During the second step the FIG. 6 structure is heated for between about 6 seconds and about 10 minutes to a temperatures of between about 400° C. and about 1,000° C., and more particularly to between about 200° C. and about 900° C. As previously stated, layer 62 protects the metal silicide from exposure to, and possible reaction with, oxygen, especially during the anneal. Annealing the FIG. 6 structure ensures that all metal which contacts polysilicon is combined with the polysilicon and is converted to metal silicide. This anneal step and the resulting conversion of metal and polysilicon to metal silicide further decreases the resistance of conductive structures formed by polysilicon 50, 16 and silicide 70 which contacts polysilicon 50, 16. After this anneal step, the structure of FIG. 7 results and comprises metal silicide 70 and unconverted metal 72.

Next, the protective layer 62 and unconverted metal 72 are removed, for example using a solution of ammonium hydroxide ($NH_4OH$), hydrogen peroxide ($H_2O_2$), and water (referred to as "APM"), or a solution of hydrochloric acid (HCl), hydrogen peroxide, and water (referred to as "HPM"). The remaining reacted film is temperature treated a second time by exposure to a temperature of between about 700° C. and about 1,000° C. for between about 1 second and about 100 seconds to form a low resistance silicide.

Figure 8:
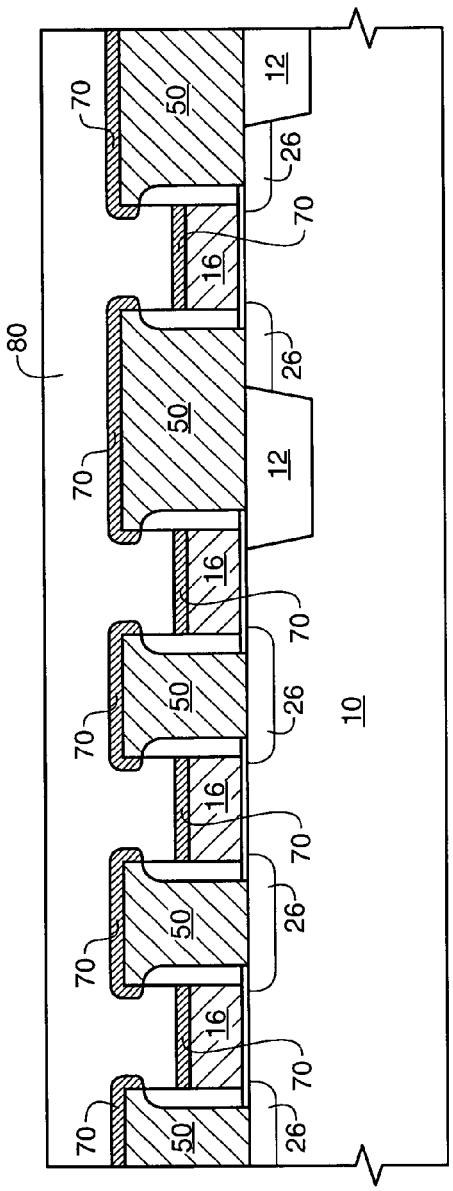
Figure 9:
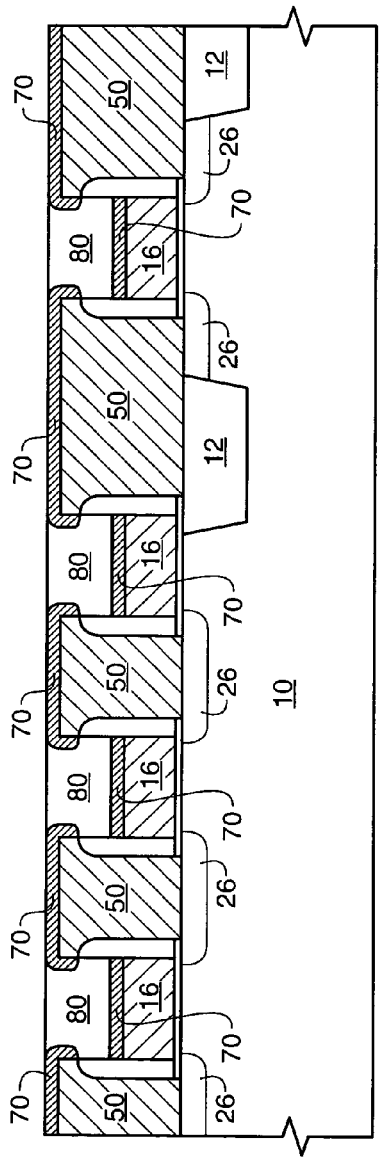
Figure 10:
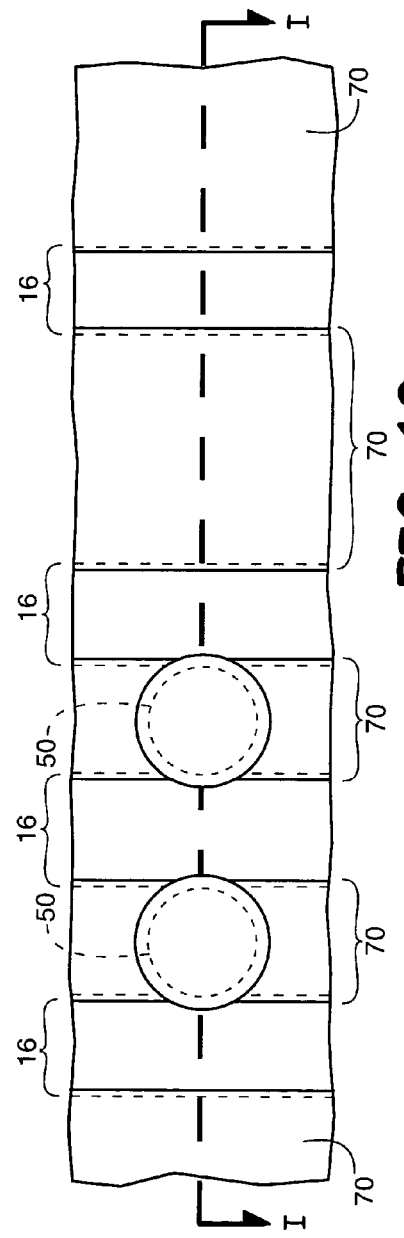
FIG. 10 is a plan view of FIG. 9, depicting intermediate structures during the formation of a semiconductor device using one embodiment of the present invention.

Subsequently, a dielectric layer 80, such as a spun-on borophosphosilicate glass layer is formed over the wafer surface as depicted in FIG. 8. After forming dielectric layer 80 of FIG. 8 it may be patterned and etched to expose silicide 70 covering plugs 50, or it may be planarized using mechanical planarization such as chemical mechanical planarization (CMP) to result in the structure of FIG. 9, depicted as I—I in the plan view of FIG. 10. Wafer processing then continues to form a semiconductor device.

Figure 11:
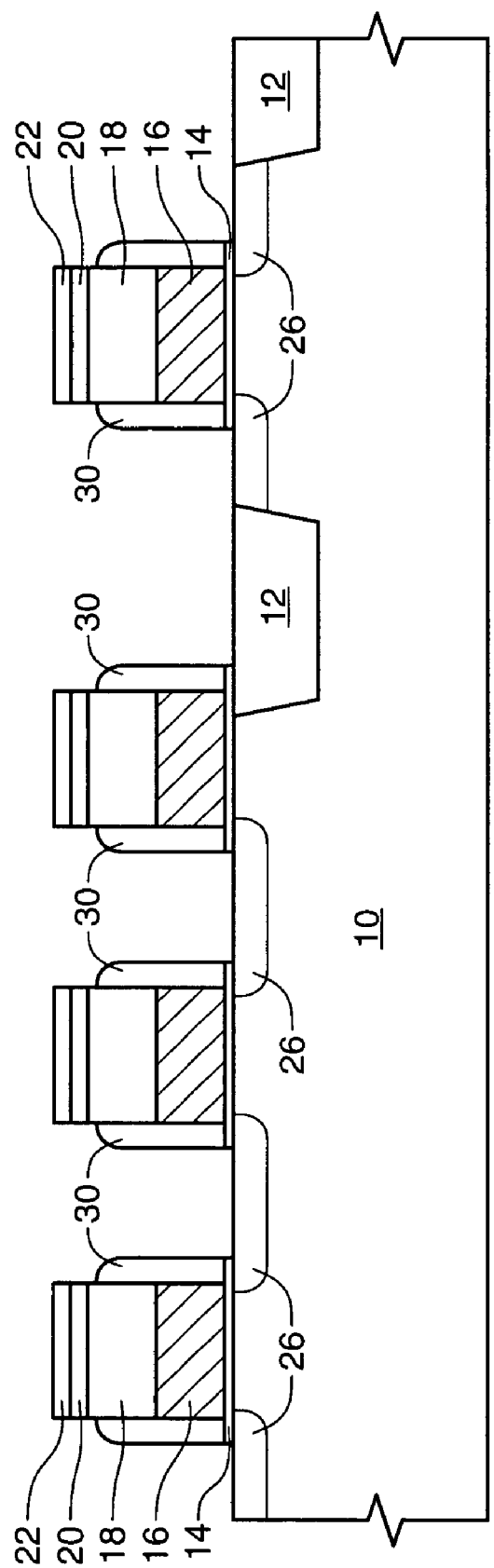
FIG. 11 is a cross section depicting an intermediate structure using a second embodiment of the present invention.

An intermediate structure of another embodiment is depicted by FIG. 11. The FIG. 11 structure is similar to the structure of FIG. 3, except that the TEOS buffer layer 18 of FIG. 3 is formed much thicker in the FIG. 11 structure. In FIG. 11, buffer layer 18 extends above the top of spacer 30, and nitride gate capping layer 20 is formed as a thinner layer than the FIG. 3 embodiment. An advantage of this embodiment is that during etching of the dielectric layers overlying polysilicon transistor gate layer 16, which occurs to the FIG. 5 structure, an etch which etches oxide selective to nitride spacer 30 can be used. This embodiment does not rely on a highly vertical etch for removal of nitride layer 20 selective to nitride spacer 30, but instead relies on the etch being selective to nitride spacer 30 relative to oxide layer 18. For example, a wet etch comprising the use of dilute hydrofluoric acid (HF) is highly selective to silicon nitride 30 and polysilicon 50, 16 when etching silicon dioxide 18.

Figure 12:
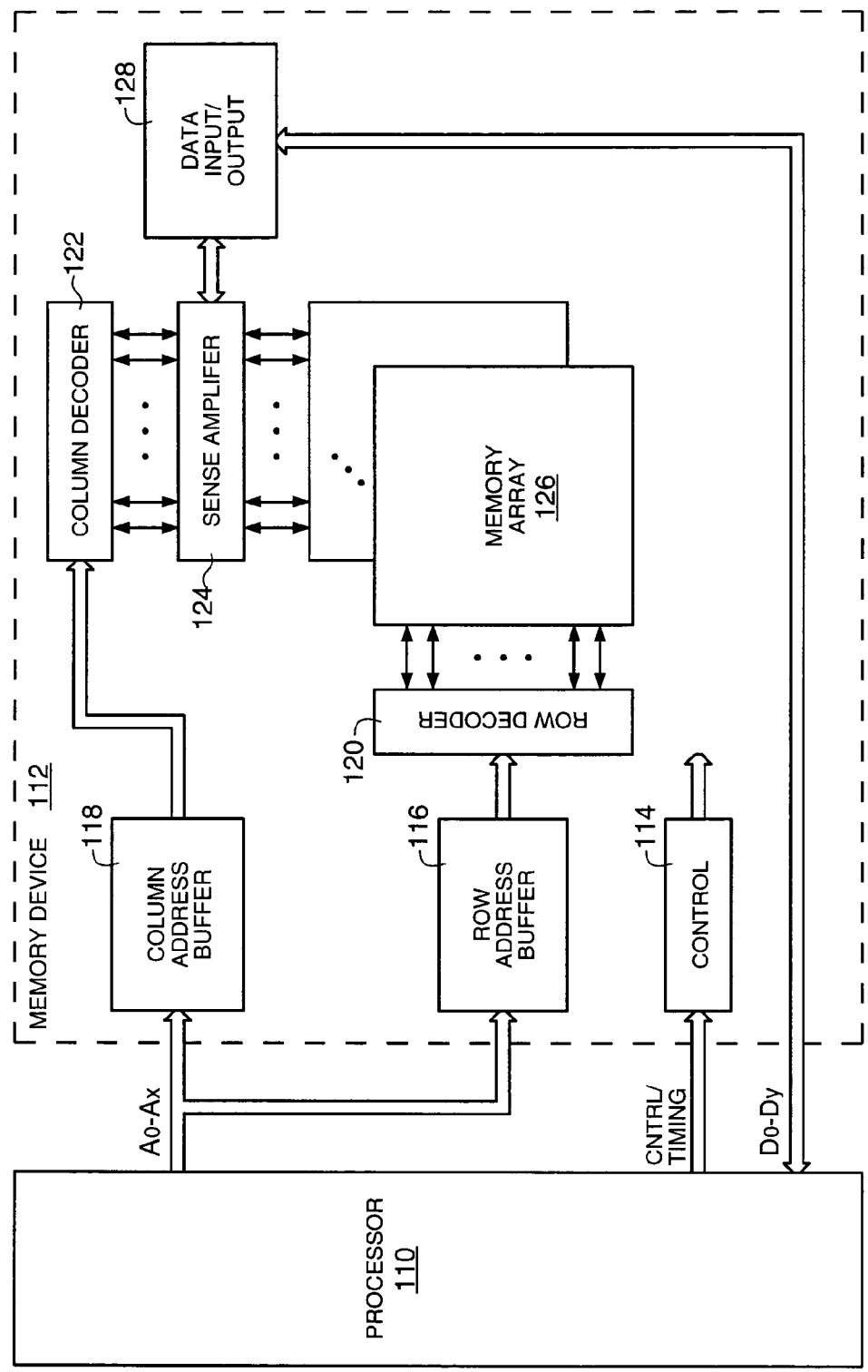
FIG. 12 is a block diagram of an exemplary use of the invention as a memory array in a dynamic random access memory.

The process and structure described herein can be used to manufacture a number of different structures which comprise a polysilicon transistor word line and/or a polysilicon plug. FIG. 12, for example, is a simplified block diagram of a memory device such as a dynamic random access memory having word lines and conductive plugs which may be formed using an embodiment of the present invention. The general operation of such a device is known to one skilled in the art. FIG. 12 depicts a processor 110 coupled to a memory device 112, and further depicts the following basic sections of a memory integrated circuit: control circuitry 114; row 116 and column 118 address buffers; row 120 and column 122 decoders; sense amplifiers 124; memory array 126; and data input/output 128.

Figure 13:
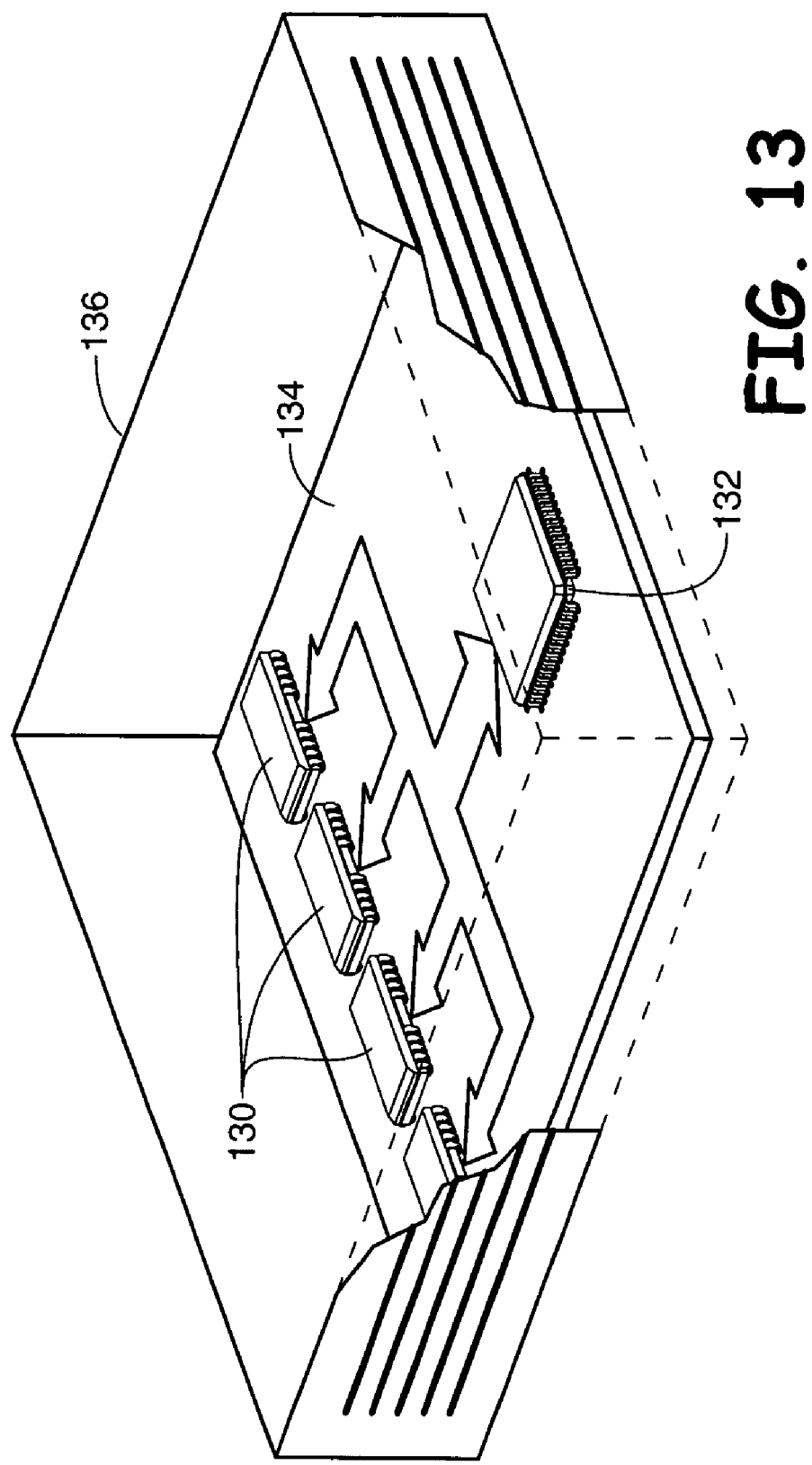
FIG. 13 is a schematic drawing depicting various exemplary uses of the invention.

As depicted in FIG. 13, a semiconductor device 130 formed in accordance with the invention may be attached along with other devices such as a microprocessor 132 to a printed circuit board 134, for example to a computer motherboard or as a part of a memory module used in a personal computer, a minicomputer, or a mainframe 136. FIG. 13 may also represent use of device 130 in other electronic devices comprising a housing 136, for example devices comprising a microprocessor 132, related to telecommunications, the automobile industry, semiconductor test and manufacturing equipment, consumer electronics, or virtually any piece of consumer or industrial electronic equipment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method for forming a semiconductor device, comprising:
    forming a first conductive layer and at least one dielectric layer on the first conductive layer;
    forming a patterned mask layer over the at least one dielectric layer and overlying the first conductive layer;
    etching the at least one dielectric layer and the first conductive layer using the mask as a pattern to form first and second cross-sectional sidewalls comprising the at least one dielectric layer and the first conductive layer;
    forming a first dielectric spacer on the at least one dielectric layer and on the first conductive layer of the first sidewall and a second dielectric spacer on the at least one dielectric layer and on the first conductive layer of the second sidewall to cause an upper surface of each sidewall to extend above an upper surface of the first and second spacers;
    forming a second conductive layer over the at least one dielectric layer and over the first conductive layer;
    removing the second conductive layer from over the first conductive layer and leaving the second conductive layer at other locations;
    etching the at least one dielectric layer to expose the first conductive layer; then
    forming a silicide layer simultaneously on the first and second conductive layers.

2. The method of claim 1 wherein the etching of the at least one dielectric layer to expose the first conductive layer is performed in the absence of a mask.

3. The method of claim 1 wherein the etch of the first conductive layer defines a plurality of transistor control gates.

4. The method of claim 3 wherein the removal of the second conductive layer from over the first conductive layer defines a plurality of conductive plugs which contact a semiconductor wafer.

5. The method of claim 1 further comprising:
    forming a first polysilicon layer during the formation of the first conductive layer and forming a second polysilicon layer during the formation of the second conductive layer;
    during the formation of the silicide layer:
        forming a metal layer selected from the group consisting of cobalt and nickel on the first and second polysilicon layers and on a portion of the first and second spacers;
        heating the metal layer to react the metal layer with the first and second polysilicon layers to form a metal silicide layer from the metal layer and the first and second polysilicon layers, wherein the metal layer on the portion of the first and second spacers remains unreacted; then
        subjecting the silicide layer and the unreacted metal layer to an etch which removes the unreacted metal layer and leaves at least a majority of the metal silicide layer.

6. The method of claim 1 further comprising:
    forming the at least one dielectric layer from a layer comprising silicon nitride; and
    forming the spacer from aluminum oxide.

7. The method of claim 1 wherein the formation of the at least one dielectric layer comprises:
    forming a first silicon dioxide layer;
    forming a silicon nitride on the first silicon dioxide layer; and
    forming a second silicon dioxide layer on the silicon nitride layer.

8. The method of claim 7 wherein an upper surface of the first silicon dioxide layer is above the upper surface of the first and second spacers.

9. The method of claim 7 wherein an upper surface of the first silicon dioxide layer is below the upper surface of the first and second spacers and an upper surface of the silicon nitride layer is above the upper surface of the first and second spacers.

10. A method used to form a semiconductor device, comprising:
    providing a blanket polysilicon word line layer and at least one dielectric layer on the word line layer;
    using a single mask, etching the word line layer and the at least one dielectric layer to define a plurality of transistor word lines;
    forming a blanket polysilicon plug layer over the plurality of transistor word lines and over the at least one dielectric layer;
    planarizing the blanket polysilicon plug layer to remove the plug layer from over the plurality of transistor word lines to form a plurality of polysilicon plugs and to expose the at least one dielectric layer;
    subsequent to forming the plurality of polysilicon plugs, using an etch selective to polysilicon to remove the at least one dielectric layer from over the plurality of transistor word lines and to expose the plurality of transistor word lines; and
    forming a self-aligned silicide layer which simultaneously forms on the plurality of transistor word lines and on the plurality of plugs.

11. The method of claim 10 further comprising:
    subsequent to etching the word line layer and the at least one dielectric layer, forming a plurality of dielectric spacers on the plurality of transistor word lines;
    during the removal of the at least one dielectric layer from over the plurality of transistor word lines, exposing a portion of each the dielectric spacer;
    forming a metal layer on the plurality of plugs, on the plurality of transistor word lines, and on the exposed portion of each dielectric spacer;
    reacting the metal layer with the plurality of transistor word lines and the plurality of plugs to form a metal silicide layer on the plurality of transistor word lines and the plurality of plugs, wherein subsequent to reacting the metal layer with the plurality of transistor word lines and the plurality of plugs, the metal layer on the exposed portion of each dielectric spacer remains unreacted; and
    etching the unreacted metal layer with an etch selective to the silicide layer such that subsequent to etching the unreacted metal layer at least a majority of the silicide layer remains.

12. The method of claim 11 further comprising forming the dielectric spacers from aluminum oxide.

13. The method of claim 11 further comprising:
    forming a first sidewall and a second sidewall from the word line layer and the at least one dielectric layer during the etch of the word line layer and the at least one dielectric layer; and forming the plurality of dielectric spacers on the plurality of transistor word lines, wherein the first and second sidewalls extend beyond an upper surface of each sidewall.

14. The method of claim 13 further comprising:

exposing a vertically-oriented portion of each sidewall during the removal of the at least one dielectric layer; and forming the metal layer on the vertically-oriented portion of each sidewall during the formation of the metal layer.

15. A method used to form a semiconductor device, comprising:

forming a blanket conductive transistor word line layer over a semiconductor wafer substrate assembly;

forming a blanket dielectric layer on the transistor word line layer;

forming a patterned mask over the blanket dielectric layer and over the blanket conductive transistor word line layer;

patterning the blanket dielectric layer and the blanket conductive transistor word line layer using the patterned mask to form a patterned dielectric layer from the blanket dielectric layer and a plurality of transistor word lines from the blanket conductive word line layer;

forming a blanket conductive plug layer over the patterned dielectric layer, over the transistor word lines, and between adjacent transistor word lines;

removing a portion of the blanket conductive plug layer by planarizing the blanket conductive plug layer in the absence of a mask layer to form a plurality of conductive plugs;

subsequent to planarizing the blanket conductive plug layer, removing the patterned dielectric layer in the absence of a mask layer to expose the plurality of transistor word lines;

subsequent to removing the patterned dielectric layer, forming a blanket metal layer on the plurality of conductive plugs, the plurality of transistor word lines, and on exposed dielectric layers;

converting the metal layer on the conductive plugs and on the transistor word lines to an enhancement layer, while the metal layer on the exposed dielectric layers remains unconverted; and removing the unconverted portion of the metal layer in the absence of a mask layer and leaving the enhancement layer.

16. The method of claim 15 further comprising forming a first silicon dioxide layer, a silicon nitride layer, and a second silicon dioxide layer during the formation of the blanket dielectric layer.

17. The method of claim 15 further comprising:

forming first and second dielectric spacers on the patterned dielectric layer and on the transistor word lines such that an inside surface of each spacer contacts the patterned dielectric layer, and wherein the patterned dielectric layer extends above a top of each of the first and second dielectric spacers;

exposing the inside surface of each of the first and second spacers during the removal of the patterned dielectric layer;

during the formation of the blanket metal layer, forming the blanket metal layer on the inside surface of each of the first and second spacers; and removing the metal layer from the inside surface of each of the first and second spacers during the removal of the unconverted portion of the metal layer in the absence of the mask.

18. A method used during fabrication of a semiconductor device, comprising:

forming at least one polysilicon transistor control gate layer over a semiconductor wafer substrate assembly;

forming a silicon dioxide buffer layer on the at least one polysilicon transistor control gate layer, wherein the silicon dioxide buffer layer has an upper surface;

etching the at least one polysilicon transistor control gate layer to define at least one polysilicon transistor control gate having first and second sidewalls and an upper surface;

forming a first silicon nitride spacer along the first sidewall of the at least one polysilicon transistor control gate and a second silicon nitride spacer along the second sidewall of the at least one polysilicon transistor control gate, wherein an upper surface of each spacer extends above the upper surface of the at least one polysilicon transistor control gate but does not extend above the upper surface of the silicon dioxide buffer layer;

forming a polysilicon plug layer over the silicon dioxide buffer layer;

planarizing the polysilicon plug layer to expose the silicon dioxide buffer layer;

etching the silicon dioxide buffer layer with an etch which is selective to the silicon nitride spacers to expose the at least one polysilicon transistor control gate;

forming a metal layer on the polysilicon plug layer, on the at least one polysilicon transistor control gate, and on the first and second silicon nitride spacers;

exposing the metal layer to an environment which reacts the metal layer with the polysilicon plug layer and with the at least one polysilicon transistor control gate to form a metal silicide, wherein the metal layer formed on the first and second silicon nitride spacers remains unreacted; and removing the unreacted metal from the silicon nitride spacers.

19. The method of claim 18 wherein the silicon dioxide buffer layer is etched with hydrofluoric acid.

20. The method of claim 18 wherein the etching of the silicon dioxide buffer layer to expose the at least one polysilicon transistor control gate is performed in the absence of a mask.

21. A method for forming a semiconductor device, comprising:

forming a first conductive layer, a first silicon dioxide layer on the first conductive layer, a silicon nitride layer on the first silicon dioxide layer, and a second silicon dioxide layer on the silicon nitride layer;

forming a patterned mask layer over the first silicon dioxide layer and over the first conductive layer;

etching the second silicon dioxide layer, the silicon nitride layer, the first silicon dioxide layer, and the first conductive layer using the mask as a pattern to form first and second cross-sectional sidewalls from the second silicon dioxide layer, the silicon nitride layer, the first silicon dioxide layer, and the first conductive layer;

forming a first dielectric spacer on the first sidewall and a second dielectric spacer on the second sidewall, where an upper surface of each sidewall is above an upper surface of the first and second spacers;

forming a second conductive layer over the first silicon dioxide layer and over the first conductive layer;

removing the second conductive layer from over the first conductive layer and leaving the second conductive layer at other locations;

etching the second silicon dioxide layer, the silicon nitride layer, the first silicon dioxide layer to expose the first conductive layer; then forming a silicide layer simultaneously on the first and second conductive layers.

22. The method of claim 21 wherein the etching of the second silicon dioxide layer, the silicon nitride layer, and the first silicon dioxide layer to expose the first conductive layer is performed in the absence of a mask.

23. The method of claim 21 wherein an upper surface of the first silicon dioxide layer is above the upper surface of the first and second spacers.

24. The method of claim 21 wherein an upper surface of the first silicon dioxide layer is below the upper surface of the first and second spacers and an upper surface of the silicon nitride layer is above the upper surface of the first and second spacers.

25. The method of claim 21 wherein the etch of the first conductive layer defines a plurality of transistor control gates.

26. The method of claim 25 wherein the removal of the second conductive layer from over the first conductive layer defines a plurality of conductive plugs which contact a semiconductor wafer.

27. A method for forming a semiconductor device, comprising:

forming a first conductive layer and at least one dielectric layer on the first conductive layer;

forming a patterned mask layer over the at least one dielectric layer and overlying the first conductive layer;

etching the at least one dielectric layer and the first conductive layer using the mask as a pattern to form first and second cross-sectional sidewalls from the at least one dielectric layer and the first conductive layer;

forming a first dielectric spacer on the first sidewall and a second dielectric spacer on the second sidewall, where an upper surface of each sidewall is above an upper surface of the first and second spacers;

forming a second conductive layer over the at least one dielectric layer and over the first conductive layer;

removing the second conductive layer from over an entire width of the first conductive layer and leaving the second conductive layer at other locations;

etching the at least one dielectric layer to expose the entire width of the first conductive layer; then forming a silicide layer simultaneously on the entire width of the first conductive layer and over the second conductive layer.

28. The method of claim 27 wherein the etching of the at least one dielectric layer to expose the first conductive layer is performed in the absence of a mask.

29. The method of claim 27 wherein the etch of the first conductive layer defines a plurality of transistor control gates.

30. The method of claim 29 wherein the removal of the second conductive layer from over the first conductive layer defines a plurality of conductive plugs which contact a semiconductor wafer.

31. The method of claim 27 further comprising:

forming a first polysilicon layer during the formation of the first conductive layer and forming a second polysilicon layer during the formation of the second conductive layer;

during the formation of the silicide layer:

forming a metal layer selected from the group consisting of cobalt and nickel on the first and second polysilicon layers and on a portion of the first and second spacers;

heating the metal layer to react the metal layer with the first and second polysilicon layers to form a metal silicide layer from the metal layer and the first and second polysilicon layers, wherein the metal layer on the portion of the first and second spacers remains unreacted; then subjecting the suicide layer and the unreacted metal layer to an etch which removes the unreacted metal layer and leaves at least a majority of the metal silicide layer.

32. The method of claim 27 further comprising:

forming the at least one dielectric layer from a layer comprising silicon nitride; and forming the spacer from aluminum oxide.

33. The method of claim 27 wherein the formation of the at least one dielectric layer comprises:

forming a first silicon dioxide layer;

forming a silicon nitride on the first silicon dioxide layer; and forming a second silicon dioxide layer on the silicon nitride layer.

34. The method of claim 33 wherein an upper surface of the first silicon dioxide layer is above the upper surface of the first and second spacers.

35. The method of claim 33 wherein an upper surface of the first silicon dioxide layer is below the upper surface of the first and second spacers and an upper surface of the silicon nitride layer is above the upper surface of the first and second spacers.

* * * * *